United States Patent [19]

Vyvial et al.

[11] 4,272,611

[45] Jun. 9, 1981

[54] PHOTOPOLYMERIZABLE COMPOSITION FOR THE PRODUCTION OF PRINTING PLATES AND RELIEF PLATES, AND THE ELEMENTS PRODUCED THEREWITH

[75] Inventors: Rudolf Vyvial, Ludwigshafen; Guenter Wallbillich, Schifferstadt; Horst Trapp, Plankstadt, all of Fed. Rep. of Germany

[73] Assignee: BASF Aktiengesellschaft, Fed. Rep. of Germany

[21] Appl. No.: 86,719

[22] Filed: Oct. 22, 1979

[30] Foreign Application Priority Data

Oct. 26, 1978 [DE] Fed. Rep. of Germany ....... 2846647

[51] Int. Cl.$^3$ .............................................. G03C 1/68
[52] U.S. Cl. ................................... 430/306; 430/325; 430/17; 430/281; 430/909
[58] Field of Search ............... 430/281, 282, 283, 284, 430/286, 287, 288, 909, 910, 306, 325, 17; 204/159.15

[56] References Cited

U.S. PATENT DOCUMENTS

| 1,971,662 | 8/1934 | Schmidt et al. | 525/56 |
|---|---|---|---|
| 2,902,365 | 9/1959 | Martin | 430/909 |
| 3,052,652 | 9/1962 | Halpern et al. | 525/56 |
| 3,794,494 | 2/1974 | Kai et al. | 430/281 |

FOREIGN PATENT DOCUMENTS

| 786119 | 11/1957 | United Kingdom . |
|---|---|---|
| 815277 | 6/1959 | United Kingdom . |
| 834337 | 5/1960 | United Kingdom . |
| 835849 | 5/1960 | United Kingdom . |
| 922457 | 4/1963 | United Kingdom . |
| 922458 | 4/1963 | United Kingdom . |
| 922459 | 4/1963 | United Kingdom . |
| 1233883 | 6/1971 | United Kingdom . |
| 1351475 | 5/1974 | United Kingdom . |

*Primary Examiner*—Won H. Louie, Jr.
*Attorney, Agent, or Firm*—Keil & Witherspoon

[57] ABSTRACT

A photopolymerizable composition for the production of water-developable printing plates and relief plates, based on a water-soluble or water-dispersible mixture, containing a photoinitiator, of (a) one or more water-soluble or water-dispersible polymers containing copolymerized N-vinylpyrrolidone units and/or one or more polymers containing vinyl alcohol units and (b) one or more olefinically unsaturated photopolymerizable monomers, which comprises, as an additive or as the sole polymer, a water-soluble modified vinyl alcohol polymer which contains from 5 to 75, especially from 10 to 60, % by weight of chemically bonded oxyethylene units. These modified vinyl alcohol polymers are in particular oxyethylated polyvinyl alcohol or hydrolyzed graft polymers of vinyl esters onto polyethylene glycols. The compositions are easier to process into printing plates and relief plates, and exhibit a long shelf life.

9 Claims, No Drawings

PHOTOPOLYMERIZABLE COMPOSITION FOR THE PRODUCTION OF PRINTING PLATES AND RELIEF PLATES, AND THE ELEMENTS PRODUCED THEREWITH

The present invention relates to an improved photopolymerizable composition for the production of water-developable printing plates and relief plates, based on a water-soluble or water-dispersible mixture, containing a photoinitiator, of a N-vinylpyrrolidone polymer or vinyl alcohol polymer and a monomer, and to the elements produced therewith.

Photopolymerizable compositions, based on polymers and monomers which can be washed out with water, for the production of printing plates and relief plates are known per se. For example, British Pat. Nos. 834,337, 1,233,883 and 1,351,475 disclose mixtures of polyvinyl alcohols with various monomers, for the production of printing plates and relief plates. The use of polyvinyl alcohol derivatives in photopolymerizable mixtures is disclosed in British Pat. Nos. 786,119, 815,277 and 835,849. However, the conventional printing plates based on such polymers leave something to be desired regarding their production, storage and processability.

In some cases, even when using selected binders, the extrudability, the water-solubility of the photopolymerizable compositions, the removal of water from the plates, the shelf life and the removal of the unexposed areas of the photopolymerizable layer by washout when developing the relief are unsatisfactory.

It is an object of the present invention to so modify the conventional compositions for the production of water-developable printing plates and relief plates, based on N-vinylpyrroldione polymers and/or vinyl alcohol polymers plus admixed monomers, that they exhibit the above processing disadvantages to a lesser extent or not at all.

We have found that this object, i.e. the desired improvement, can be achieved with a photopolymerizable composition for the production of water-developable printing plates and relief plates, which is based on (ie. which consists, to the extent of more than 50% by weight, of) a water-soluble or water-dispersible mixture, containing a photoinitiator, of (a) one or more water-soluble or water-dispersible polymers containing copolymerized N-vinylpyrrolidone units and/or one or more water-soluble or water-dispersible polymers containing vinyl alcohol units and (b) one or more olefinically unsaturated photopolymerizable monomers, wherein at least a proportion of the polymer in the mixture is a water-soluble modified vinyl alcohol polymer which contains from 5 to 75, especially from 10 to 60, % by weight of $O—CH_2—CH_2$ units in chemically bonded from in the polymer molecule.

The use of the above modified vinyl alcohol polymers according to the invention in the polymer-monomer mixtures has a number of advantages, some of them unexpected. Whilst with the conventional polyvinyl alcohol/monomer mixtures for printing plates the choice of a suitable, frequently expensive, polyvinyl alcohol is a critical factor in achieving satisfactory product characteristics, the additives according to the invention permit the use of other, cheaper and hitherto not usable polyvinyl alcohols. They greatly facilitate the production of printing plates having reproducible properties, even where there are unavoidable fluctuations in the properties of the polyvinyl alcohol binders as a result of these having been prepared batchwise. The polymer additives according to the invention, present in the composition, furthermore permit much wider variation of certain constituents of the formulation which affect the properties of the composition, and also permit the use of higher contents of certain monomers and the additional use of some monomers which were hitherto classified as incompatible and were therefore not used as an additional component.

The compositions according to the invention, however, also exhibit improved processability compared to the conventional mixtures based on polyvinyl alcohol and monomers. The preparation of clear homogeneous solutions is made easier, during molding there is virtually no phase separation, and during drying and storage of the printing plates there is virtually no sweating-out of such formulation constituents as monomers; this avoids pollution of the air in the work area when processing the compositions into, for example, blank material and printing plates. Printing plates produced from the mixtures according to the invention have the additional advantage that during exposure the negative does not stick thereto and is not soiled, and its optical and other properties are not impaired; furthermore, the time required for washing out is shorter. Printing or relief plates produced from compositions according to the invention in the conventional manner exhibit less sensitivity to moisture, less brittleness and improved affinity for ink, as compared with comparable prior art products.

Water-soluble modified vinyl alcohol polymers which contain from 5 to 75, preferably from 10 to 60, especially from 15 to 40, % by weight of $O—CH_2—CH_2$ units, ie. oxyethylene units or reacted ethylene oxide units, chemically bonded in the polymer molecule, are known per se and their preparation is described, for example, in German Pat. Nos. 575,141, 1,081,229 and 1,094,457, French Pat. No. 1,239,634 and U.S. Pat. No. 3,052,652. Modified vinyl alcohol polymers in which at least the majority of the oxyethylene units are present in the form of

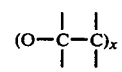

blocks, where x is not less than 4, are very suitable.

Highly suitable water-soluble modified vinyl alcohol polymers are the water-soluble reaction products of a vinyl alcohol polymer or polyvinyl alcohol with ethylene oxide, where the proportion of reacted ethylene oxide units in the reaction product corresponds to the above percentages, which relate to the finished reaction product. The preparation of these reaction products is known per se and is described, for example, in German Pat. No. 575,141, French Pat. No. 1,239,634 and U.S. Pat. No. 3,052,652. Such poducts may be prepared by reacting the vinyl alcohol polymer with ethylene oxide under the conventional oxyethylation conditions in the presence of an acidic or basic catalyst. Examples of suitable catalysts for the reaction of polyvinyl alcohol with ethylene oxide are antimony pentafluoride, aluminum chloride, sulfuric acid, boron trifluoride etherate, alkali metal hydroxides, alkali metal alcoholates, amines and benzyltrimethylammonium hydroxide, amongst which sulfuric acid, boron trifluoride etherate and benzyltrimethylammonium hydroxide are preferred. In general, the oxyalkylation requires from about 2 to 12 hours at from 30° to 150° C. Suitable vinyl alcohol polymers or polyvinyl alcohols, which terms mean, for the purpose of the invention, polymers and copolymers which contain recurring —$CH_2$—CH(OH)— units in the polymer molecule, are those which on reaction with ethylene oxide give water-soluble reaction products. Polyvinyl esters hydrolyzed to the extent of from about 70 to 100 mole %, in particular hydrolyzed polyvinyl acetates having a molecular weight of from about 5,000 to 200,000, especially from 15,000 to 50,000, are especially suitable.

Other very suitable water-soluble modified vinyl alcohol polymers are those prepared by hydrolyzing a graft polymer of a vinyl ester of a monocarboxylic acid onto polyethylene glycol. The preparation of such modified vinyl alcohol polymers is described, in particular, in German Pat. Nos. 1,081,229 and 1,094,457, and the preparation of the starting materials, ie. of the vinyl ester graft polymers, is described particularly in German Pat. No. 1,077,430. Vinyl esters of monocarboxylic acids particularly suitable for the preparation of the graft polymers include, in addition to, for example, vinyl benzoate, commercial vinyl esters of aliphatic monocarboxylic acids of 2 to 18 carbon atoms, e.g. vinyl propionate, vinyl butyrate and especially vinyl acetate. Suitable polyethylene glycols or polyethylene oxides for the graft polymerization, which is advantageously carried out in a homogeneous phase in the presence of a free radical activator, are those of more than four oxyethylene units in the molecule, preferably those with molecular weights of from 2,000 to 25,000. Modified polyvinyl alcohols of this type, in which from 30 to 98 mole %, and especially from 60 to 95 mole %, of the ester groups of the vinyl ester graft polymer are hydrolyzed, are very suitable. However, in every case the resulting modified vinyl alcohols should be water-soluble.

The water-soluble modified vinyl alcohol polymers may be added to the other polymeric binders of the compositions according to the invention in any desired amount. In general, the amount added is from 10 to 100% by weight of the amount of N-vinylpyrrolidone polymer and/or vinyl alcohol polymer contained in the mixture, but the modified polyvinyl alcohol can also account for the greater part (more than 50% by weight, for example from 51 to 99% by weight) of the total amount of polymer in the composition, or may be the sole polymeric binder in the photopolymerizable composition.

Suitable polymers with copolymerized N-vinylpyrrolidone units are the conventional homopolymers of N-vinylpyrrolidone and the conventional copolymers of N-vinylpyrrolidone with comonomers, such as vinyl esters, e.g. vinyl acetate, provided they are water-soluble or at least water-dispersible. Hydrolyzed N-vinylpyrrolidone/vinyl ester copolymers may also be used.

Other polymers with vinyl alcohol units suitable for use in the photopolymerizable composition include the conventional polymers and copolymers containing recurring $CH_2CH(OH)$ structural units in the polymer chain, provided they are water-soluble or water-dispersible. Details may be found in the relevant cited prior art. The conventional hydrolyzed polyvinyl esters, e.g. hydrolyzed polyvinyl acetates or polyvinyl propionates, having a mean degree of polymerization of from 200 to 3,000, especially from 250 to 700, and a degree of hydrolysis of from 65 to about 100, especially from 80 to 88, mole percent, are particularly suitable. Mixtures of vinyl ester polymers or vinyl ester copolymers of different degrees of polymerization and/or degrees of hydrolysis may also be used and may be advantageous for certain purposes.

Suitable olefinically unsaturated photopolymerizable monomers for use in the photopolymerizable composition are the conventional monomers containing one or more olefinically unsaturated double bonds, but preferably at least a proportion of the monomers should contain more than one olefinically unsaturated double bond per molecule. The nature and amount of the monomers are determined on the one hand by the intended application of the photopolymerizable composition, for example the desired hardness of the relief plates produced therewith, and on the other hand by the compatibility of the monomers with the polymers used in the composition, and the requirement that the mixture should remain water-soluble or water-dispersible. The use, according to the invention, of the modified vinyl alcohol polymer in the compositions not only improves the water-solubility and water-disersibility, but also contributes toward an increase in the compatibility of certain monomers and accordingly widens the range within which the type and amount of monomer can be selected.

Examples of preferred monomers are those containing hydroxyl groups, amide groups or polyethylene glycol structural units. Monoacrylates, polyacrylates, monomethacrylates and polymethacrylates of monohydric and polyhydric low molecular weight alcohols are very suitable, examples being compatible hydroxyalkyl acrylates and methacrylates, e.g. $\beta$-hydroxyethyl acrylate, $\beta$-hydroxypropyl acrylate, $\beta$-hydroxyethyl methacrylate, ethylene glycol diacrylate and dimethacrylate, polyethylene glycol diacrylate and dimethacrylate, propylene glycol diacrylate and dimethacrylate, butane-1,4-diol diacrylate and dimethacrylate, 1,1,1-trimethylolpropane triacrylate and trimethacrylate and glycerol diacrylate, dimethacrylate, triacrylate and trimethacrylate. In general, the total amount of monomers is from about 10 to 70% by weight of the combined total amount of monomers and polymers in the composition, and is preferably from 25 to 50% by weight.

The compositions according to the invention furthermore contain conventional amounts, namely from 0.001 to 10% weight of the sum of the amounts of monomers and polymers, of one or more photoinitiators which should be compatible with the mixture. Examples include benzoin or benzoin derivatives, e.g. benzoin methyl ether, $\alpha$-methylbenzoin ethyl ether, $\alpha$-methylolbenzoin methyl ether, benzoin isopropyl ether, benzil, benzil ketals, e.g. benzil dimethylketal and benzil ethylene glycol ketal, polynuclear quinones, e.g. 9,10-anthraquinone, and the like.

It is often also advantageous to add to the composition other conventional assistants and additives, such as thermal polymerization inhibitors, e.g. hydroquinone, hydroquinone derivatives, nitrophenols or salts of N-nitrosocyclohexylhydroxylamine, plasticizers and/or dyes, depending on the intended application of the composition.

Regarding the processing of the composition into printing plates and the production and development of relief plates, reference may be made to the prior art known to the skilled artisan, and to the patents cited at the beginning of the present application.

In the Examples and Comparative Experiments which follow, parts and percentages are by weight, unless stated otherwise. The molecular weights indicated are viscosity-average molecular weights.

The K values specified are determined on 1 percent strength by weight aqueous solutions by the method of H. Fikentscher, Cellulosechemie 13 (1932), 60.

COMPARATIVE EXPERIMENT 1

232 Parts of a polyvinylpyrroidone having a molecular weight of from 600,000 to 800,000 (K value 92) are dissolved in 514 parts of deionized water at 90° C. 70.4 Parts of 1,1,1-trimethylolpropane trimethacrylate are then added, followed by a solution of 10 parts of benzil dimethylketal, 0.2 part of N-nitrosocyclohexylhydroxylamine and 0.02 part of eosin in 91.7 parts of $\beta$-hydroxyethyl methacrylate, the additions being made whilst stirring. The resulting mixture is cloudy and inhomogeneous and cannot be used to produce a coating.

EXAMPLE 1

In accordance with the procedure of the preceding Comparative Experiment, 135 parts of a water-soluble oxyethylated polyvinyl acetate which was hydrolyzed to the extent of 79 mole % prior to oxyethylation (molecular weight 25,000-30,000, K value 37.5, 22% content of oxyethylene units) and 145 parts of the polyvinylpyrrolidone specified in the above Comparative Experiment are successively dissolved in 450 parts of deionized water at 90° C. A solution of 12.5 parts of benzil dimethylketal, 0.25 part of N-nitrosocyclohexylhydroxylamine and 0.025 part of eosin in a mixture of 110 parts of $\beta$-hydroxyethyl methacrylate and 88 parts of 1,1,1-trimethylolpropane trimethacrylate is then added slowly to the aqueous solution at 70° C. The resulting slightly cloudy viscous solution is degassed under reduced pressure, 20 parts of water being distilled off.

A 400μm thick, hard, non-tacky coating is produced by applying the mixture to a steel sheet provided with a layer of adhesive, and drying for 24 hours at room temperature. Exposure for 3 minutes through a negative in a flat-plate exposure unit equipped with fluorescent tubes, and development with water in a spray washer for 2 minutes at 40° C. under 3.2 bar, followed by drying at an elevated temperature, produces a plate which has excellent mechanical properties and gives several thousand high-quality prints on a proof press.

COMPARATIVE EXPERIMENT 2

232 Parts of the polyvinylpyrrolidone described in Comparative Experiment 1 are dissolved in 300 parts of methanol. A solution of 10.0 parts of benzil dimethylketal, 0.2 part of N-nitrosocyclohexylhydroxylamine and 0.02 part of eosin in a mixture of 120 parts of $\beta$-hydroxyethyl methacrylate and 38.4 parts of 1,1,1-trimethylolpropane trimethacrylate is added. The clear, viscous solution is degassed, 62 parts of methanol being distilled off. As described in Example 1, a coating is produced on a steel sheet. The coating is slightly cloudy and hardens after being stored for a few days at room temperature. At the same time, however, exudation to the surface occurs to an increasing extent, so that imagewise exposure is impossible without the negative being damaged.

EXAMPLE 2

As a modification of the above Comparative Experiment, 160 parts of polyvinylpyrrolidone of the above type, followed by 71.6 parts of the oxyethylated partially hydrolyzed polyvinyl acetate described in Example 1, are dissolved in 370 parts of deionized water. A solution of 10.0 parts of benzil dimethylketal, 0.2 part of N-nitrosocyclohexylamine and 0.02 part of eosin in a mixture of 120 parts of $\beta$-hydroxyethyl methacrylate and 38.4 parts of 1,1,1-trimethylolpropane trimethacrylate is then added to the aqueous solution. After it has been degassed, the mixture is applied to untreated aluminum sheets to give a coating about 500μm thick, the coating then being dried for 24 hours at room temperature. The resulting plates are sufficiently hard and possess a dry surface which does not change even on continued storage.

The blank material is exposed for 1.5 minutes through a negative in a flat-plate exposure unit equipped with fluorescent tubes, and is then developed with water in a spray washer (2 minutes, 40° C., 3.2 bar), after which the plate is dried at an elevated temperature. The hard, tough relief layer exhibits excellent adhesion to the sheet metal base. High-quality prints are obtained with the plate on a proof press.

COMPARATIVE EXPERIMENT 3

249 Parts of a N-vinylpyrrolidone/vinyl acetate copolymer (containing the monomers in a weight ratio of 70/30 and having a K value of 38) are dissolved in 249 parts of ethanol. A solution of 6.0 parts of α-methylolbenzoin methyl ether, 0.3 parts of N-nitrosocyclohexylhydroxylamine and 0.015 part of eosin in 45 parts of 1,1,1-trimethylolpropane trimethacrylate is added, whilst stirring. The initially clear batch turns cloudy on distilling off a portion of the solvent (1.34 parts). The mixture is applied to a sheet metal base provided with a layer of adhesive, and the coating is dried for two days at room temperature. The resulting cloudy coating shows unsatisfactory exposure characteristics.

EXAMPLE 3

In accordance with the procedure of the preceding Comparative Experiment, 174 parts of the above vinylpyrrolidone/vinyl acetate copolymer are dissolved in 174 parts of ethanol. In addition, a solution of 75 parts of a partially hydrolyzed polyvinyl acetate, containing 22% of oxyethylene units, in 150 parts of deionized water is prepared. The two solutions are combined and a solution of 6.0 parts of α-methylolbenzoin methyl ether, 0.3 part of N-nitrosocyclohexylhydroxylamine and 0.015 part of eosin in 45 parts of 1,1,1-trimethylolpropane trimethacrylate is then added.

140 Parts of solvent are distilled from the resulting solution. After applying the residual mixture to a sheet metal base provided with a layer of adhesive and drying the coating for two days at room temperature, a non-tacky, sufficiently firm, only slightly cloudy coating 530μm thick is obtained.

Pre-exposure for 2 seconds, followed by imagewise exposure for 4 minutes using a flat-plate exposure unit equipped with fluorescent tubes, development with water in a spray washer (2.5 minutes, 40° C., 3.2 bar) and drying at 60° C. give a plate which has excellent mechanical properties and from which excellent prints are obtained on a proof press.

EXAMPLE 4

294 Parts of a partially hydrolyzed polyvinyl acetate (degree of hydrolysis 82 mole percent; mean degree of polymerization 500) are dissolved in 294 parts of water by stirring for several hours at 90° C. After the solution has cooled to 70° C., 33.5 parts of a reaction product of ethylene oxide with a polyvinyl acetate which has previously been hydrolyzed to the extent of 85 mole % (molecular weight 30,000–35,000, 24% content of oxyethylene units) are added whilst stirring. Thereafter, a solution of 51 parts of butane-1,4-diol dimethacrylate, 9.6 parts of benzil dimethylketal and 1.0 part of 2,6-di-tert.-butyl-p-cresol in 241 parts of β-hydroxyethyl methacrylate is stirred into the mixture. The homogeneous, viscous solution is filtered and is degassed under reduced pressure.

A 500μ m thick non-tacky coating is obtained by applying the solution to a sheet steel support provided with a layer of adhesive and drying for 24 hours at room temperature. Pre-exposure for 6 seconds, exposure for 60 seconds through a negative, using a flat-plate exposure unit equipped with fluorescent tubes, development with water in a spray washer (2 minutes 20 seconds at 40° C., 3.2 bar) and subsequent drying at an elevated temperature result in a plate which has excellent mechanical properties and gives several thousand high-quality prints on a proof press.

EXAMPLE 5

243 Parts of a partially hydrolyzed polyvinyl acetate (degree of hydrolysis 82 mole percent, mean degree of polymerization 500) are dissolved in 243 parts of fully deionized water by stirring for several hours at 90° C. After the solution has cooled at 70° C., 81 parts of a polyvinyl acetate which has previously been hydrolyzed to the extent of 83 mole % (molecular weight 35,000–50,000, 54% content of oxyethylene units) are added whilst stirring. A solution of 51 parts of butane-1,4-diol dimethacrylate, 9.6 parts of benzil dimethylketal and 1.0 part of 2,6-di-tert.-butyl-p-cresol in 241 parts of β-hydroxyethyl methacrylate is then added, whilst stirring. The batch is filtered and degassed under reduced pressure.

A 500 μm thick non-tacky, homogeneous coating is obtained by applying the solution to a sheet steel support provided with a layer of adhesive and drying for 24 hours at room temperature. The blank material is pre-exposed for 5 seconds in a flat-plate exposure unit equipped with fluorescent tubes and is then exposed imagewise through a negative. The plate is developed in a spray washer (2 minutes 15 seconds at 40° C., 3.2 bar) and is dried at an elevated temperature. The resulting plate has good mechanical properties, the relief image being very well structured and somewhat resilient. The proofs produced with this plate are flawless.

EXAMPLE 6

The starting materials are the same as in the preceding Example, and only the ratio of the polymeric components is varied, namely 294 parts of the partially hydrolyzed polyvinyl acetate are dissolved in 294 parts of fully deionized water and 41 parts of the water-soluble modified vinyl alcohol polymer are added. The remaining components are as in the preceding Example.

Using the same procedure as before, a printing plate is obtained which has comparable application properties but is harder than the plate in the preceding Example. In this case, again, the proofs are of very good quality.

EXAMPLE 7

176 Parts of a water-soluble partially hydrolyzed vinyl acetate polymer containing 22% of oxyethylene units (molecular weight 25,000–30,000) are dissolved in 176 parts of fully deionized water by stirring for several hours at 80° C. After the solution has cooled to 70° C. a mixture of 124 parts of β-hydroxyethyl methacrylate and 26 parts of heptaethylene glycol dimethacrylate, 5 parts of benzil dimethylketal and 0.7 part of N-nitrosocyclohexylhydroxylamine are stirred in. After degassing under reduced pressure, the solution is applied to a sheet steel support provided with a layer of adhesive, and is then dried for 24 hours at room temperature. The resulting plate is pre-exposed in a flat-plate exposure unit for 3 seconds and then exposed for 90 seconds through a negative. After washing out (2.5 minutes, 3.2 bar, 50° C.) and drying (120° C., 4 minutes), a plate having excellent printing properties is obtained.

EXAMPLE 8

130 Parts of a partially hydrolyzed polyvinyl acetate (degree of hydrolysis 88 mole %, mean degree of polymerization 500) and 70 parts of a partially hydrolyzed graft polymer (having a mean degree of polymerization $\bar{P}_w$ of about 460) of vinyl acetate onto polyethylene glycol are dissolved in 200 parts of water at 90° C. After this solution has cooled to 80° C., a solution comprising 160 parts of hydroxypropyl acrylate, 40 parts of butane-1,4-diol dimethacrylate, 6.4 parts of benzil dimethylketal and 1 part of a 1:1 mixture of hydroquinone and hydroquinone monomethyl ether is added. The resulting homogeneous solution is filtered and degassed under reduced pressure.

A 500 μm thick non-tacky coating is obtained by applying the solution to a sheet steel support provided with a layer of adhesive, and drying for 24 hours at room temperature. Pre-exposure for 6 seconds, and exposure for 60 seconds through a negative, using a flat-plate exposure unit equipped with fluorescent tubes, followed by developing with water in a spray washer (3.5 minutes at 40° C., 3 bar) and subsequent drying at an elevated temperature result in a completely satisfactory relief printing plate.

We claim:

1. A photopolymerizable composition for the production of water-developable printing plates and relief plates which comprises: a water-soluble or water-dispersible mixture containing a photoinitiator, one or more olefinically unsaturated photopolymerizable monomers and one or more water-soluble or water-dispersible polymers containing vinyl alcohol units, wherein at least 10% by weight of said polymers containing vinyl alcohol units is a water-soluble vinyl alcohol polymer or copolymer containing recurring —CH$_2$—CH(OH)—units in the polymer molecule and which is modified to contain from 5 to 75% by weight of chemically bonded O—CH$_2$—CH$_2$—units in the polymer molecule.

2. The photopolymerizable composition of claim 1, wherein the proportion of O—CH$_2$—CH$_2$ units in the water-soluble modified vinyl alcohol polymer is from 10 to 60% by weight.

3. The photopolymerizable composition of claim 1, wherein the water-soluble modified polyvinyl alcohol accounts for the greater part of the amount of polymer in the mixture or is the sole polymer in the mixture.

4. The photopolymerizable composition of claim 1, wherein the water-soluble modified vinyl alcohol polymer is a reaction product of a vinyl alcohol polymer with ethylene oxide, the proportion of reacted ethylene oxide units in the reaction product being from 5 to 75% by weight.

5. The photopolymerizable composition of claim 1, wherein the water-soluble modified vinyl alcohol polymer has been prepared by hydrolyzing a graft polymer of vinyl esters of monocarboxylic acids onto polyethylene glycol.

6. The photopolymerizable composition of claim 5, wherein from 30 to 98 mole % of the ester groups of the vinyl ester graft polymer are hydrolyzed.

7. An element for the production of printing plates and relief plates comprising a photopolymerizable coating applied to a support, wherein the said coating contains a photopolymerizable composition as set forth in claim 1.

8. The photopolymerizable composition of claim 1 which additionally contains a water soluble or water dispersable polymer containing N-Vinylpyrrolidone units.

9. A process for the production of relief plates comprises imagewise exposing the photopolymerizable coating of an element of claim 7 to radiation and removing the unexposed areas of said coating, thereby forming a relief plate.

* * * * *